United States Patent
Tseng et al.

(10) Patent No.: US 7,514,730 B2
(45) Date of Patent: Apr. 7, 2009

(54) METHOD OF FABRICATING A NON-FLOATING BODY DEVICE WITH ENHANCED PERFORMANCE

(75) Inventors: Horng-Huei Tseng, Hsin-Chu (TW); Jhy-Chyum Guo, Hsin-Chu (TW); Chenming Hu, Hsin-Chu (TW); Da-Chi Lin, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 269 days.

(21) Appl. No.: 11/032,403

(22) Filed: Jan. 10, 2005

(65) Prior Publication Data

US 2005/0156156 A1    Jul. 21, 2005

Related U.S. Application Data

(63) Continuation of application No. 10/641,575, filed on Aug. 14, 2003, now Pat. No. 6,847,098, which is a continuation of application No. 10/318,471, filed on Dec. 13, 2002, now Pat. No. 6,627,515.

(51) Int. Cl.
*H01L 29/06* (2006.01)

(52) U.S. Cl. .............................. 257/288; 257/E31.049; 257/401

(58) Field of Classification Search ........................ None
See application file for complete search history.

(56) References Cited

U.S. PATENT DOCUMENTS

| | | | |
|---|---|---|---|
| 5,670,412 A | 9/1997 | Juengling | |
| 5,726,090 A * | 3/1998 | Jang et al. | 438/435 |
| 5,963,817 A | 10/1999 | Chu et al. | |
| 5,998,807 A * | 12/1999 | Lustig et al. | 257/66 |
| 6,235,567 B1 | 5/2001 | Huang | |
| 6,251,751 B1 | 6/2001 | Chu et al. | |
| 6,255,147 B1 | 7/2001 | Buynoski | |
| 6,528,399 B1 * | 3/2003 | Alieu et al. | 438/561 |
| 6,703,271 B2 * | 3/2004 | Yeo et al. | 438/221 |
| 6,724,008 B2 | 4/2004 | Fitzgerald | |
| 6,774,409 B2 | 8/2004 | Baba et al. | |
| 6,784,035 B2 | 8/2004 | Snyder et al. | |
| 6,943,385 B2 * | 9/2005 | Usuda et al. | 257/190 |
| 7,037,794 B2 * | 5/2006 | Beintner et al. | 438/300 |
| 7,087,965 B2 * | 8/2006 | Chan et al. | 257/347 |
| 2001/0051406 A1 * | 12/2001 | Weimer et al. | 438/240 |
| 2002/0008289 A1 | 1/2002 | Murota et al. | |
| 2002/0125502 A1 | 9/2002 | Baba et al. | |

* cited by examiner

*Primary Examiner*—Evan Pert
*Assistant Examiner*—Ben P Sandvik
(74) *Attorney, Agent, or Firm*—Haynes and Boone, LLP

(57) ABSTRACT

Provided is a semiconductor transistor device including a substrate having at least two regions, a semiconductive region extending to a first surface of the substrate and an insulative region extending to a second surface of the substrate. The semiconductor transistor device also includes a patterned semiconductor structure overlying both surfaces of the substrate. The patterned semiconductor structure includes a source or drain region overlying the second surface of the substrate. The semiconductor transistor device further includes a patterned gate structure overlying the patterned semiconductor structure.

13 Claims, 6 Drawing Sheets

METHOD OF FABRICATING A NON-FLOATING BODY DEVICE WITH ENHANCED PERFORMANCE

CROSS-REFERENCE

This application is a continuation of U.S. application Ser. No. 10/641,575 filed Aug. 14, 2003, which is a continuation of U.S. application Ser. No. 10/318,471 filed Dec. 13, 2002, now U.S. Pat. No. 6,627,515, which is hereby incorporated by reference.

BACKGROUND

Devices formed in silicon layers, which in turn completely overly an insulator, have allowed reductions in performance degrading parasitic capacitances to be realized. The increased performance of devices fabricated using silicon on insulator (SOI), technology however is achieved at higher processing costs when compared to counterpart devices formed in, and only overlying, semiconductor material. The increased cost of SOI devices is attributed to the additional processing used to form the SOI layer, with a first option featuring bonding procedures. A second option, also resulting in increased processing cost, is formation of the SOI layer via implantation of oxygen ions into a semiconductor wafer followed by an anneal cycle resulting in an silicon oxide layer located underlying a thin portion of unimplanted silicon. In addition to the increased processing costs incurred with the SOI technology, the presence of an insulator layer on the entire surface of the semiconductor can result in a floating body effect, wherein the semiconductor substrate is floating with respect to the device channel region. This can result in unwanted threshold voltages thus adversely influencing designed operating conditions.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

A method of forming a semiconductor device, such as a device having a strained silicon shape, wherein portions of the device are formed in a region of the strained silicon shape located overlying a silicon alloy layer, while other portions of the device are formed in regions of the strained silicon shape located overlying silicon oxide regions, will now be described in detail. It is understood, however, that the following description provides embodiments, or examples, of the present invention. Other embodiments can also benefit from the present invention.

Figure 1:
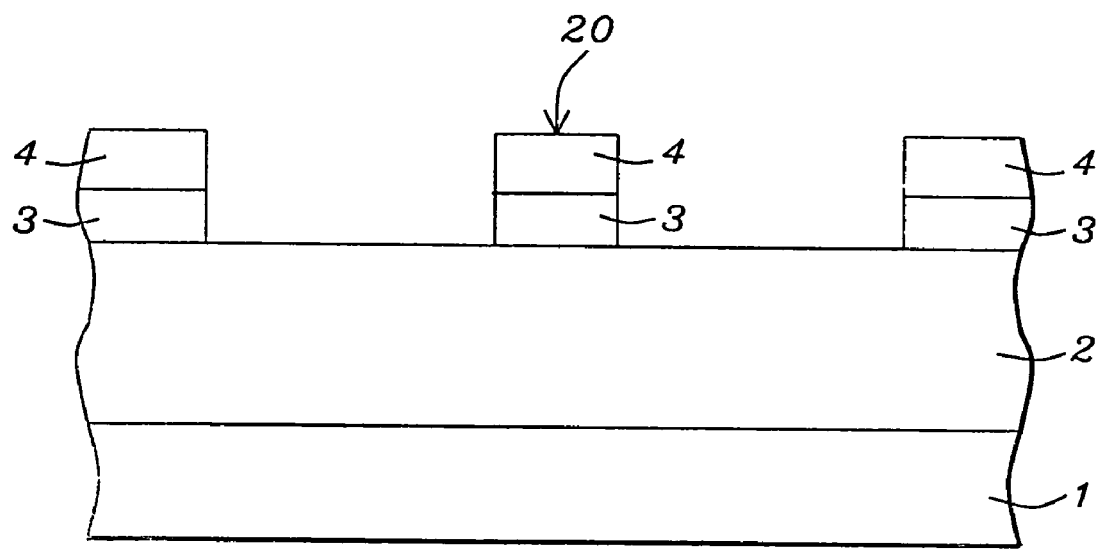
FIGS. 1-8, which schematically, in cross-sectional style, show a first embodiment of this invention in which a device is formed in a strained silicon shape, wherein portions of the device are formed in a region of the strained silicon shape located overlying a silicon alloy layer, while other portions of the device are formed in regions of the strained silicon shape located overlying thermally grown silicon oxide regions.

Semiconductor substrate 1, comprised of P type, single crystalline silicon, featuring a <100> crystallographic orientation, is used and schematically shown in FIG. 1. Silicon alloy layer 2, comprised of silicon-germanium or silicon-germanium-carbon, is next epitaxially grown on semiconductor substrate 1, using silane and disilane as a silicon source, while germane is used as a germanium source. Since alloy layer is grown to a thickness between about 100 to 10,000 Anstroms, with the silicon-germanium option denoted as $Si_{(1-y)}Ge_y$, wherein y is the mole percent of geranium, between about 5 to 55%. Silicon layer 3, is next formed over silicon alloy layer 2, at a thickness between about 5 to 5,000 Angstroms, silane or disilane as a source. The growth procedures on an underlying silicon alloy layer, as well as optional post-epitaxial growth anneal, result in strained silicon layer 3. The resulting strained silicon layer when used as a channel region for a subsequent metal oxide semiconductor field effect transistor (MOSFET) device, presents increased carrier mobility, and thus increased performance, when compared to counterpart MOSFET devices formed with non-strained channel regions. Silicon nitride layer 4, is next deposited via low pressure chemical vapor deposition (LPCVD), or plasma enhanced chemical vapor deposition (PECVD), procedures, to a thickness between about 100 to 1,000 Angstroms. Photolithographis and reactive ion etching (RIE) procedures are next employed to define composite shapes 20, each comprised of silicon nitride shape 4, and underlying strained silicon shape 3. The RIE procedure is performed using $Cl_2$ as an etchant for silicon nitride and for the strained silicon layer, with the procedure terminated at the appearance of silicon alloy layer 2. After definition of composite shapes 20, the photolithographic shape used as an etch mask, not shown in the drawings, is removed via plasma oxygen ashing procedures. The result of these procedures are schematically shown in FIG. 1.

Figure 2:
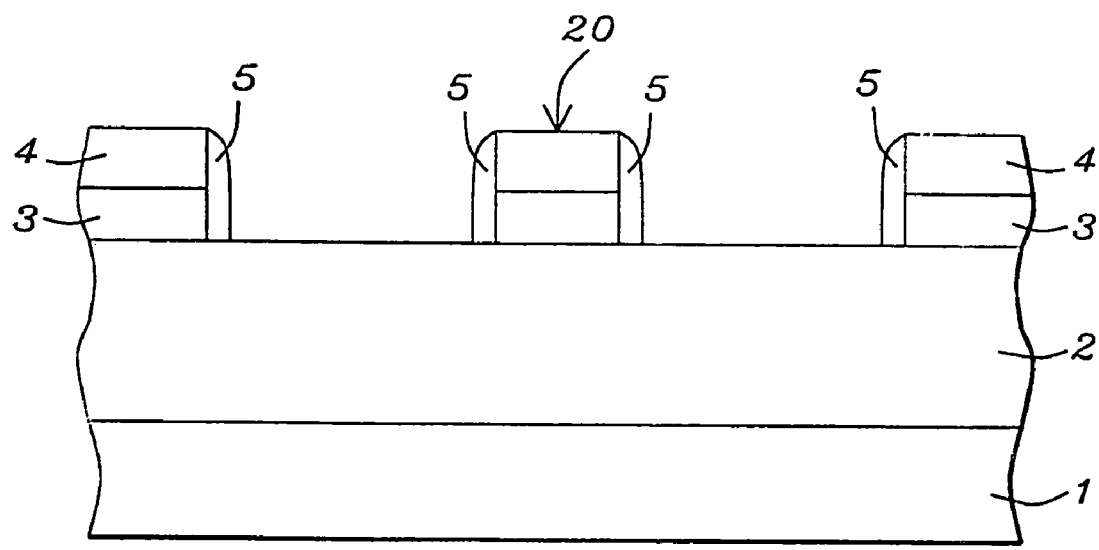

Silicon nitride spacers 5, are next formed on the sides of composite shapes 20, to protect strained silicon shapes 3, from a subsequent thermal oxidation procedure. A silicon nitride layer is deposited at a thickness between 50 to 1,000 Angstroms, via LPCVD or PECVD procedures, followed by an anisotropic RE procedure performed using $Cl_2$ as an etchant, resulting in the definition of silicon nitride spacer 5. This is schematically shown in FIG. 2. A thermal oxidation procedure is next performed in an oxygen containing ambient, at a temperature between about 700 to 1200° C., resulting in the formation of silicon alloy oxide regions 6. Portions of silicon alloy oxide regions 6, at a thickness between about 2,000 to 12,000 Angstroms, are thermally grown in the areas of silicon alloy layer 2, exposed between comprise shapes 20, while other portions of silicon alloy oxide regions 6, are formed underlying the edges of strained silicon shape 3. The top surface of the portions of silicon alloy oxide regions 6, located between composite shapes 20, is located above the strained silicon shape-silicon alloy layer interface. This is schematically shown in FIG. 3.

Figure 3:
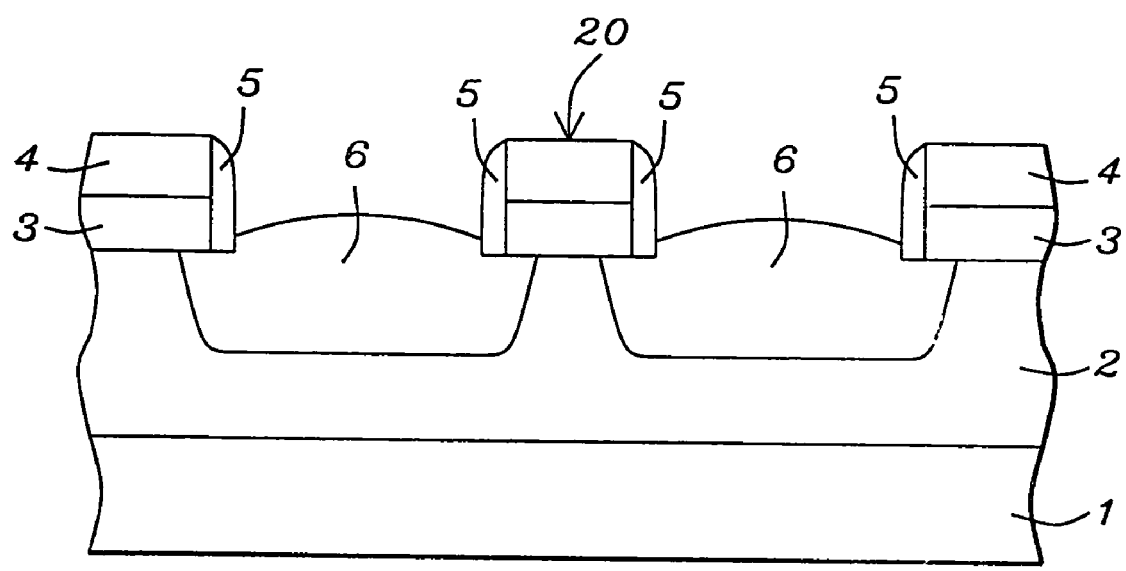
Figure 4:
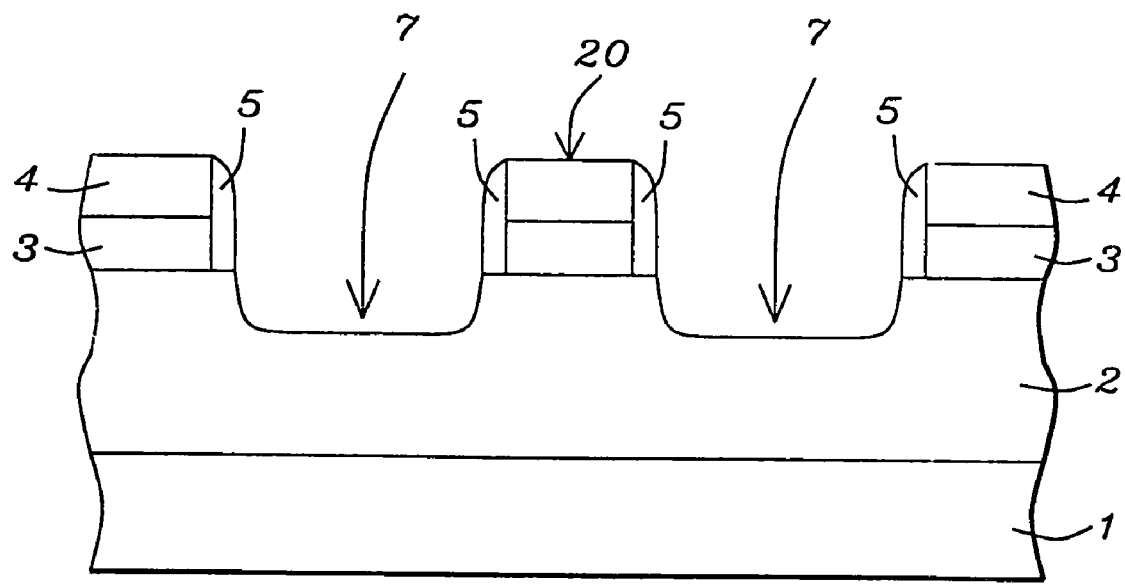
Figure 5:
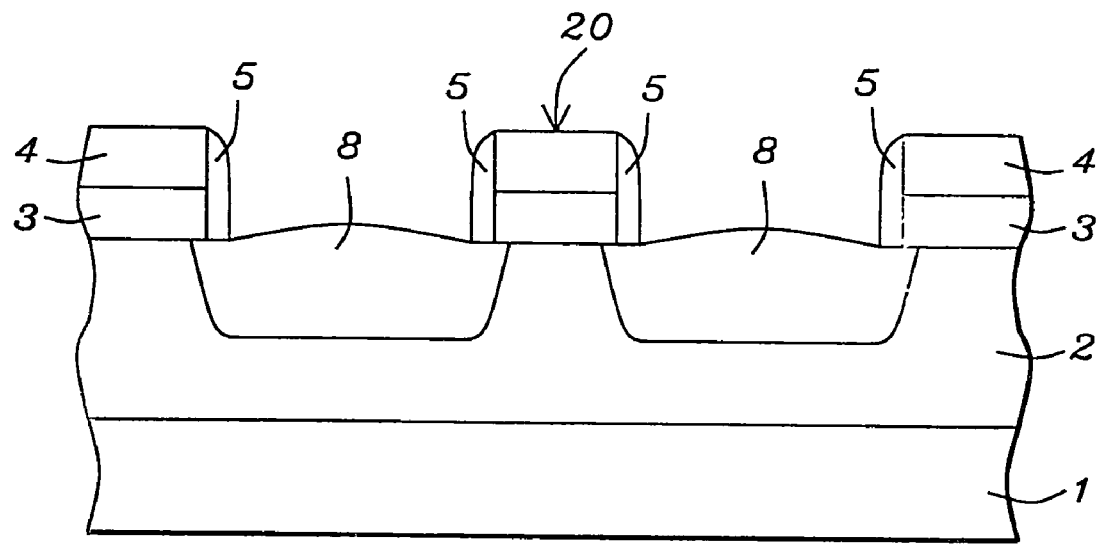

An iteration allowing the top surface of the silicon alloy oxide regions to be located at the same height as the strained silicon shape-silicon alloy layer interface, is next addressed and schematically shown using FIGS. 4-5. After definition of silicon nitride spacers 5, on the sides of composite shapes 20, a blanket RIE procedure is used to remove, and to recess, a to portion of silicon alloy layer 2, located between composite shapes 20. This is accomplished using $SF_6$ as a selective etchant for silicon alloy layer 2. The top surface of opening 7, schematically shown in FIG. 4, is now located below the strained silicon-silicon alloy layer interface. The thermal oxidation procedure previously described in FIG. 3, is again employed to form silicon alloy oxide regions 8, in openings 7, however with the top surface of silicon alloy oxide regions 8, now adjacent to the strained silicon shape-silicon alloy layer interface. Silicon alloy oxide regions 8, again thermally grown to a thickness between about 1,000 to 10,000 Angstroms, underlays a portion of, or the edges of strained silicon shape 3. This is schematically shown in FIG. 5.

Figure 6:
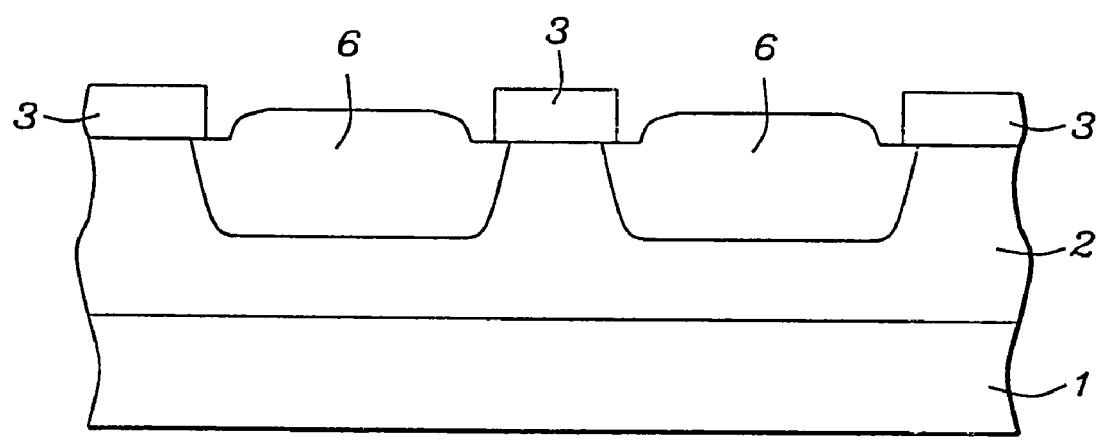
Figure 7:
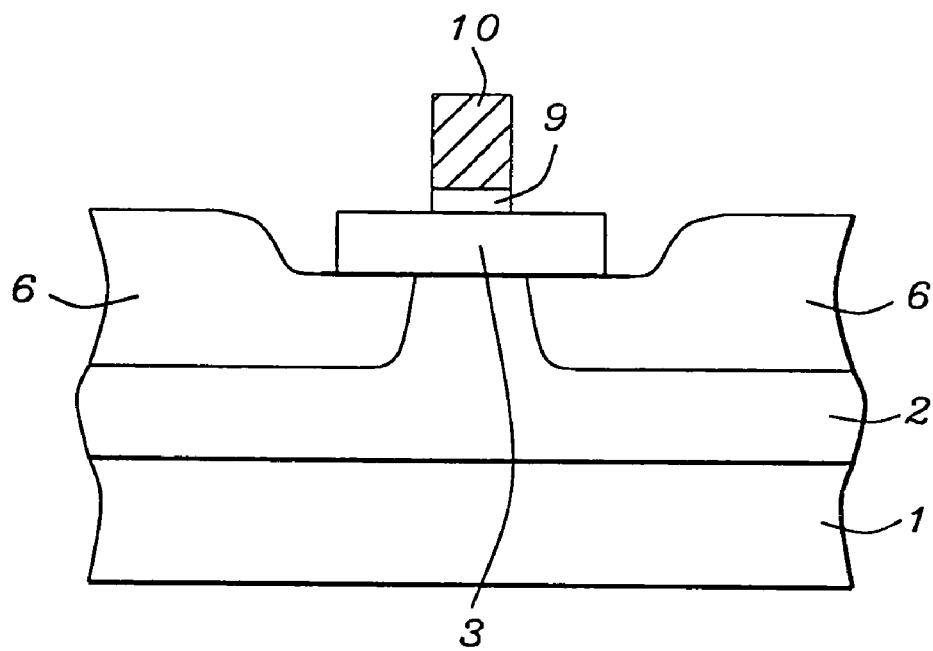

Returning to the structure shown in FIG. 3, a hot phosphoric acid solution is used to selectively remove silicon nitride shapes 4, as well as silicon nitride spacers 5. The resulting structure featuring strained silicon shape 3, with a certain portion located on silicon alloy layer 2, and with peripheral or edges of the strained silicon shape located on silicon alloy oxide region 6, is schematically shown in FIG. 6. The fabrication of a MOSFET device in strained silicon shape 3, is next addressed and schematically described using FIGS. 7-8. Gate insulator layer 9, comprised of silicon dioxide is formed on the surface of strained silicon shape 3, to a thickness between about 5 to 100 Angstroms, via thermal oxidation procedures performed in an oxygen-steam ambient. A conductive layer such as a doped polysilicon, or metal silicide, at a thickness between about 500 to 3,000 Angstroms, is next formed on gate insulator layer 9, via chemical vapor deposition (CVD), procedures. The polysilicon layer can be doped in situ during deposition via the addition of arsine, phosphine, or diborane, to a silane or disilane ambient, or the polysilicon layer can be deposited instrinsically then doped via implantation of arsenic, phosphorous or boron ions. The metal silicide option can be a tungsten silicide, tantalum silicide, titanium silicide layer, obtained via CVD or via plasma vapor deposition procedures. A photoresist shape, not shown in the drawings, is used as an etch mask to allow an anisotropic RIE procedure to define gate structure 10, on gate insulator 9, using $Cl_2$ as a selective etchant. The result of these procedures is schematically shown in FIG. 7. The photoresist shape used to define gate insulator layer 9, is removed via plasma oxygen ashing and wet clean procedures, with a buffered hydrofluoric acid cycle, used as part of the wet clean procedure, removing portions of gate insulator layer 9, not covered by gate structure 10.

Figure 8:
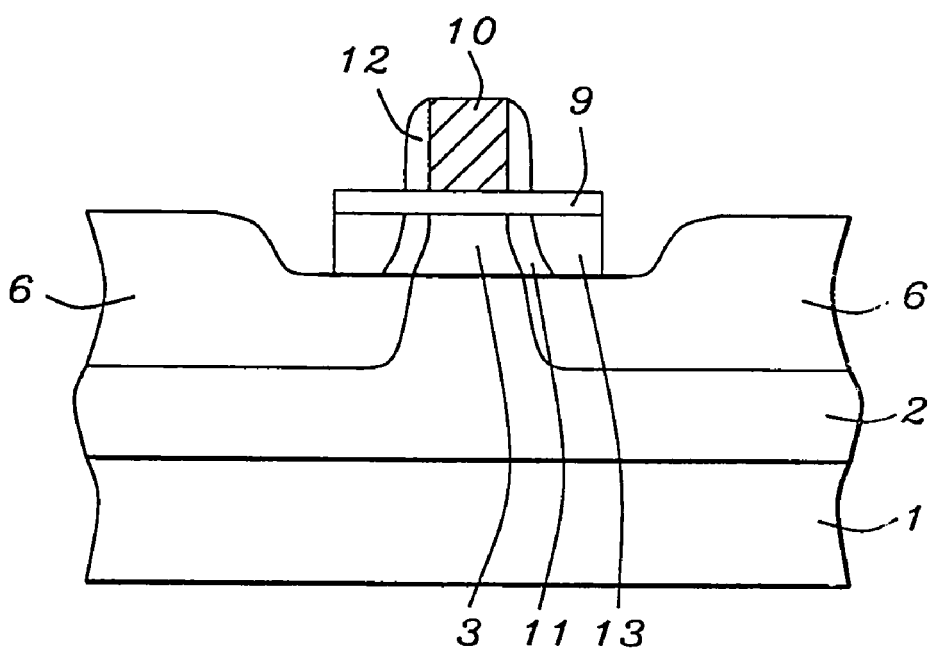

The example of the MOSFET device being formed in strained silicon shape 3, will be an N channel device therefore requiring N type source/drain regions. However if desired this invention can also be applied to P channel MOSFET devices, where P type source/drain regions would be formed. N type, lightly doped source/drain region 11, is formed in portions of strained silicon shape 3, not covered by gate structure 10, via implantation of phosphorous or arsenic ions, implanted at an energy between about 1 to 100 KeV, at a dose between about 1E13 to 1E15 atoms/cm². An insulator layer such as silicon oxide or silicon nitride is next deposited to a thickness between about 100 to 2,500 Angstroms, via LPCVD or PECVD procedures. An anisotropic RIE procedure, performed using $CHF_3$ as an etchant for the silicon oxide option, or using $Cl_2$ as an etchant for the silicon nitride option, is used to form insulator spacers 12, on the sides of gate structure 10. Heavily doped, N type source/drain region 13, is next formed in portions of strained silicon shape 3, not covered by gate structure 10, or by insulator spacer 12, via implantation of arsenic or phosphorous ions, implanted at an energy between about 1 to 100 KeV, at a dose between about 5E13 to 1E16 atoms/cm². An anneal cycle is used to activate the dopants in all source/drain regions. The result of these procedures is schematically shown in FIG. 8. The MOSFET device features a channel region located on silicon alloy layer 3, while the source/drain regions overlay insulator region eliminates the junction capacitance, and performance decreases, encountered with counterpart MOSFET devices in which the source/drain regions are formed in the semiconductor substrate. In addition the ability to define the MOSFET channel region on an underlying conductive region, eliminates the floating body effect.

Figure 9:
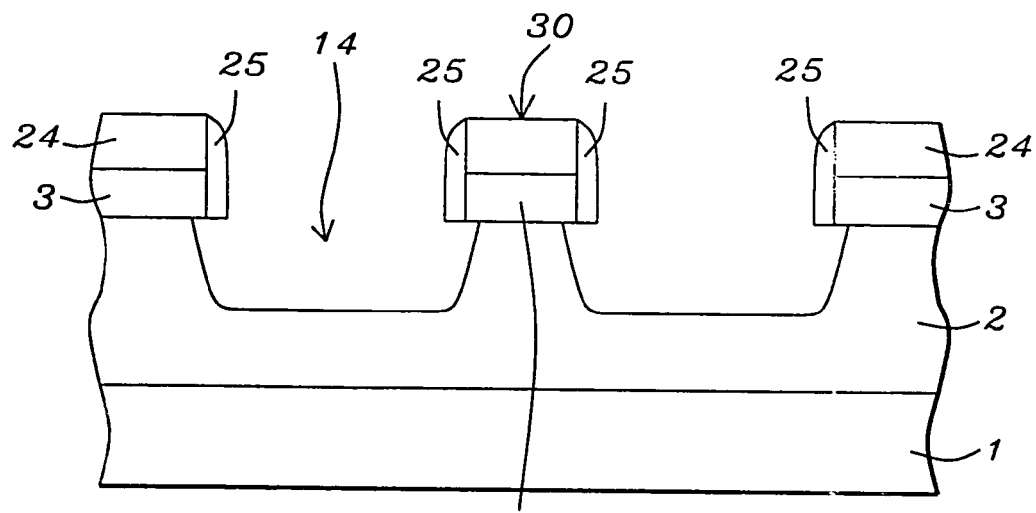
FIGS. 9-13, which schematically, in cross-sectional style, show a second embodiment of this invention in which a device is formed in a strained silicon shape, wherein portions of the device are formed in a region of the strained silicon shape located overlying a silicon alloy layer, while other portions of the device are formed in regions of the strained silicon shape located overlying a silicon oxide shape, wherein the silicon oxide shape was established via silicon oxide refill of an isotropically formed opening in the silicon alloy layer.
Figure 10:
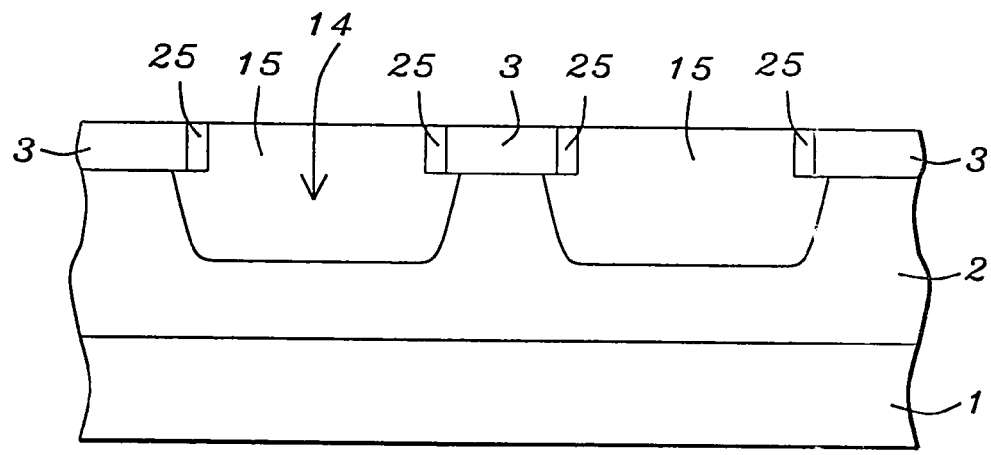
Figure 11:
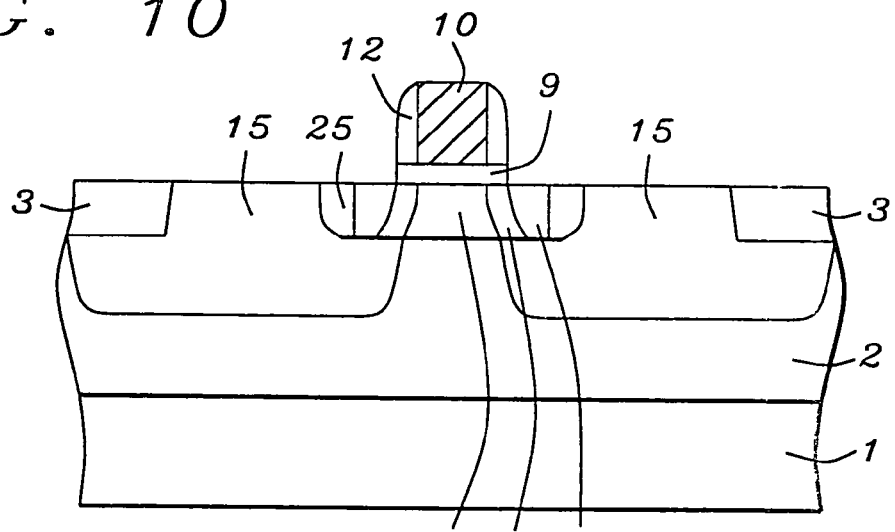

A second embodiment of this invention allowing a portion of a MOSFET device to overlay an insulator region, is next addressed. This embodiment will feature a silicon oxide region formed in an opening in the silicon alloy layer, later filled with a silicon oxide layer. Referring to FIG. 9, composite shapes 30, each comprised of underlying strained silicon shape 3, and overlying silicon oxide shape 24, are formed on underlying silicon alloy layer 2. Strained silicon shape 3, is obtained and defined using the identical processing procedures used to obtain the strained silicon shape of the first embodiment. Silicon oxide shape 24, is comprised of silicon oxide layer obtained via LPCVD or PECVD procedures at a thickness between about 100 to 1,000 Angstroms, defined prior to definition of strained silicon shape 3, during an anisotropic RIE procedure using $CHF_3$ as an etchant. Silicon oxide spacers 25, are next formed n the sides of composite spacers 30, via deposition of a silicon oxide layer, at a thickness between about 100 to 1,000 Angstroms, using LPCVD or PECVD procedures, followed by an anisotropic RIE procedure, using $CHF_3$ as an etchant for silicon oxide. A selective dry etch procedure is next employed to remove exposed regions of silicon alloy layer 2, using $Cl_2$ or $SF_6$ as a selective etchant for silicon alloy layer 2. The dry etch procedure is performed at a pressure which introduces an isotropic component allowing isotropic opening 14, extending under the edges or periphery of composite shapes 30, to be realized. This is schematically shown in FIG. 9. A silicon oxide layer is next deposited via a high density plasma (HDP), procedure, to a thickness between about 1,000 to 5,000 Angstroms, completely filling opening 14. A chemical mechanical polishing procedure is next used to selectively remove regions of the HDP silicon oxide layer not located in opening 14, while also selectively removing silicon oxide shapes 24. The result of these procedures, schematically shown in FIG. 10, feature a planarized structure comprised of strained silicon shape 3, embedded in silicon oxide region 15, with peripheral regions of strained silicon shape 3, located overlying silicon region 15. FIG. 11, schematically shows a MOSFET device formed in strained silicon shape 3, using the identical processes and thickness used in the first embodiment of this invention for formation of gate insulator layer 9, gate structure 10, lightly doped source/drain region 11, insulator spacers 12, and for heavily doped source/drain region 13.

Figure 12:
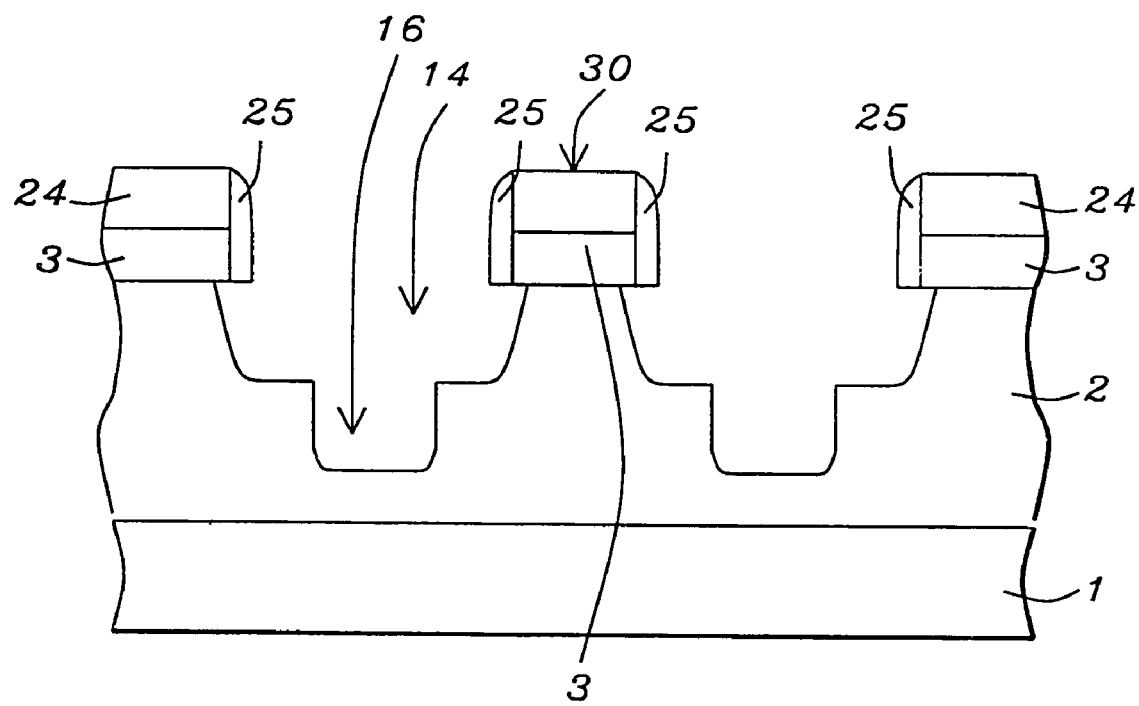
Figure 13:
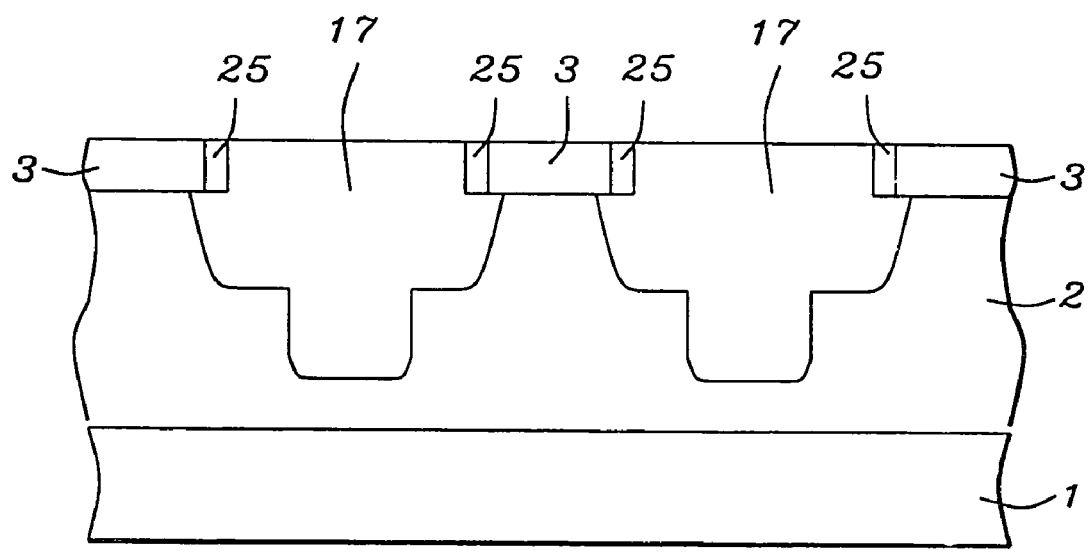

An iteration of the second embodiment, allowing a deeper refilled, silicon oxide region to be formed, is next addressed and described using FIGS. 12-13. After isotropically forming opening 14, in silicon alloy layer 2, as previously shown in FIG. 9, the pressure in the dry etch tool is decreased allowing anisotropic opening 16, to be formed in a lower region of silicon alloy layer 2. Opening 16, is formed in regions of silicon alloy layer defined in the space between composite shapes 30, via an anisotropic RIE procedure using $Cl_2$ or $SF_6$ as a selective etchant. This is schematically shown in FIG. 12. Filling of openings 14, and 16, is again accomplished via a HDP procedure, deposition silicon oxide layer 17, to a thickness between about 1,000 to 5,000 Angstroms, completely filling the openings. A chemical mechanical polishing procedure is then used to remove regions of silicon oxide layer 17, not located in opening 14, or 16, with the procedure also removing silicon oxide shapes 24. The result of the chemical mechanical polishing procedure is a planarized structure comprised of strained silicon shape 3, embedded in silicon oxide region 17, with the peripheral regions of strained silicon shape 3, located overlying silicon oxide region 17. This is schematically shown in FIG. 13.

While this invention has been particularly shown and described with reference to, the embodiments thereof, it will be understood by those skilled in the art that various changes in form and details may be made without departing form the spirit and scope of this invention.

What is claimed is:

1. A semiconductor device on a semiconductor substrate, comprising:
    a silicon alloy layer on said semiconductor substrate;
    insulator filled openings in a top portion of said silicon alloy layer, with portions of said insulator filled openings recessed at edge of said insulator filled openings;
    a strained silicon shape comprised with a first segment of strained silicon shape overlying a portion of said silicon alloy layer located between said insulator filled openings, and comprised of attached second segments of said strained silicon shape located on top surface of recessed portions of said insulator filled openings;
    an insulator spacer located on a side of said strained silicon shape, wherein a top surface and a bottom surface of the insulator spacer is planar with a top surface and a bottom surface of the strained silicon shape respectively;
    a gate insulator layer on a top surface of said strained silicon shape;
    a conductive gate structure on said gate insulator layer in an area in which said gate insulator layer overlays a portion of said first segment of strained silicon shape; and
    a doped source/drain region in a portion of said strained silicon shape not covered by said conductive gate structure.

2. The method of claim 1, wherein said semiconductor alloy layer is a silicon-germanium layer.

3. The method of claim 1, wherein said semiconductor alloy layer is a silicon-germanium-carbon layer.

4. The method of claim 1, wherein said insulator, layer is a silicon nitride layer.

5. A semiconductor transistor device comprising:
    a substrate having at least two regions, a semiconductive region extending to a first surface of the substrate and an insulative region extending to a second surface of the substrate;
    a patterned semiconductor structure overlying both surfaces of the substrate, the patterned semiconductor structure including a source or drain region overlying the second surface of the substrate;
    an insulator spacer located on the side of the source or the drain region, and embedded in the insulative region, wherein a top surface and a bottom surface of the insulator spacer is planar with a top surface and a bottom surface of the source or drain region respectively; and
    a patterned gate structure overlying the patterned semiconductor structure.

6. The semiconductor transistor device of claim 5 wherein the source or drain region does not overly the first surface of the substrate.

7. The semiconductor transistor device of claim 5 wherein the patterned semiconductor structure is in direct contact with the substrate.

8. The semiconductor transistor device of claim 5 wherein the source or drain region overlies only a portion of the second surface.

9. The semiconductor transistor device of claim 5 further comprising:
    insulator material on level with and surrounding the patterned semiconductor structure, wherein the insulator material and the patterned semiconductor structure have a common planar surface.

10. The semiconductor transistor device of claim 5 wherein the source or drain region includes a lightly doped portion and a heavier doped portion.

11. The semiconductor transistor device of claim 5 wherein the patterned semiconductor structure comprises strained silicon.

12. The semiconductor transistor device of claim 5 wherein the semiconductive region of the substrate includes silicon germanium.

13. The semiconductor transistor device of claim 12 wherein the semiconductive region of the substrate further includes carbon.

* * * * *